US007657809B1

(12) United States Patent
Bhatia (10) Patent No.: US 7,657,809 B1
(45) Date of Patent: Feb. 2, 2010

(54) DUAL SCAN CHAIN DESIGN METHOD AND APPARATUS

(75) Inventor: Sandeep Bhatia, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 172 days.

(21) Appl. No.: 10/718,445

(22) Filed: Nov. 19, 2003

(51) Int. Cl.
 *G01R 31/28* (2006.01)
(52) U.S. Cl. .................. 714/729; 714/726; 714/731
(58) Field of Classification Search .............. 714/726, 714/729, 731
 See application file for complete search history.

(56) References Cited

U.S. PATENT DOCUMENTS

| 6,079,040 | A | * | 6/2000 | Hom et al. | 714/738 |
|---|---|---|---|---|---|
| 6,114,892 | A | | 9/2000 | Jin | |
| 6,158,032 | A | | 12/2000 | Currier et al. | |
| 6,377,912 | B1 | | 4/2002 | Sample et al. | |
| 6,418,545 | B1 | * | 7/2002 | Adusumilli | 714/729 |
| 6,455,336 | B1 | | 9/2002 | Berndlmaier et al. | |
| 6,873,185 | B2 | | 3/2003 | Cox, William D. | |
| 6,574,762 | B1 | | 6/2003 | Karimi et al. | |
| 6,694,464 | B1 | | 2/2004 | Quayle et al. | |
| 6,901,544 | B1 | * | 5/2005 | Huth et al. | 714/731 |
| 7,111,209 | B2 | | 9/2006 | Rajski et al. | |
| 2003/0204802 | A1 | * | 10/2003 | Sim | 714/726 |
| 2004/0078741 | A1 | * | 4/2004 | Morton | 714/726 |
| 2005/0015689 | A1 | | 1/2005 | Eppensteiner et al. | |

FOREIGN PATENT DOCUMENTS

JP 2003-202362 * 7/2003

OTHER PUBLICATIONS

Jaramillo et al., 10 Tips for Successful Scan Design: Part one, Feb. 17, 2000, ednmag.com, pp. 67-73,75.*
Jaramillo et al., 10 Tips for Successful Scan Design: Part two, Feb. 17, 2000, ednmag.com, pp. 77,78,80,82,84,86,88,90.*
Balakrishnan, K. J., et al., "*Deterministic Test Vector Decompression in Software Using Linear Operations*", Proceedings of the 21st IEEE VLSI Test Symposium, Apr. 27 - May 1, 2003, pp. 225- 231, IEEE, Los Alamitos, CA, USA.
Bardell, P. H. et al., "*Build-In Test for VLSI: Pseudorandom Techniques*", 1987. pp. 61-313, John Wiley and Sons, New York, USA.
Bhatia, S., "*Test Compaction by Using Linear-Matrix Driven Scan Chains*", Proceedings of the 18$^{th}$ IEEE International Symposium on Defect and Fault Tolerance in VLSI Systems, Nov. 3-5, 2003, pp. 185-190, IEEE, USA.
Bhatia, S., "*Test Compaction in a Parallel Access Scan Environment*", Proceedings of the 6$^{th}$ Asian Test Symposium (ATS '97), Nov. 17-19, 1997, pp. 300 -305, IEEE, Los Alamitos, CA, USA.

(Continued)

*Primary Examiner*—John J Tabone, Jr.
(74) *Attorney, Agent, or Firm*—Vista IP Law Group, LLP (57) ABSTRACT

A method for testing an integrated circuit includes scanning test data from an input and an output pin into a first scan chain during a first state of a clock cycle, and scanning test data from the same input and output pins into a second scan chain during a second state of the clock cycle.

20 Claims, 5 Drawing Sheets

OTHER PUBLICATIONS

Hellebrand. S., et al., "*Generation of Vector Patterns Through Reseeding of Multiple-Polynomial Linear Feedback Shift Registers*", Proceedings of the International Test Conference, 1992, pp. 120-124, France.

Hsu, F. F. et al., "*A Case Study on the Implementation of the Illinois Scan Architecture*", Proceedings of the International Test Conference; 2001, pp. 538-547, International Test Conference, Washington, D.C., USA.

Kiefer, G. et al., "*Deterministic BIST with Multiple Scan Chains*", Proceedings of the International Test Conference, 1998, pp. 1057-1064, International Test Conference, Washington, D.C., USA.

Krishna, C.V. et al., "*Reducing Test Data Volume Using LFSR Reseeding with Seed Compression*", Proceedings of the International Test Conference, 2002, pp. 321-330, International Test Conference, Washington, D.C., USA.

McCluskey, E. J., "*Test Data Compression*", Design & Test of Computers, Mar.-Apr. 2003, pp. 76-87, vol. 20, Issue 2, IEEE Computer Society and the IEEE Circuits and Systems Society, USA.

Rajski, J. et al., "*Embedded Deterministic Test for Low Cost Manufacturing Test*", Proceedings of the International Test Conference, 2002, pp. 310-310, International Test Conference, Washington, D. C., USA.

\* cited by examiner

DUAL SCAN CHAIN DESIGN METHOD AND APPARATUS

FIELD OF THE INVENTION

The invention is related to the field of testing integrated circuits.

BACKGROUND

Design for Testability (DFT) is an important requirement for today's complex application specific integrated circuit (ASIC) designs. DFT techniques allow one to perform high quality manufacturing tests after a chip has been synthesized, and to sort out good chips from bad ones. However, due to the ever increasing complexity of today's designs, the Automatic Test Equipment (ATE) tools required for testing are quite complex and expensive. As a result, manufacturing test costs have become a major part of the overall manufacturing cost of ASICs. Conventional testing approaches are unable to reduce this cost without sacrificing the test quality.

For example, the use of scan based Automatic Test Pattern Generation (ATPG) is a common DFT methodology that is widely used. Scan logic allows internal sequential elements of an ASIC, such as a flip-flops, to be controlled and observed during testing. The flip-flops are connected into several chains, called scan chains, which are usually accessed through test pins. The test pins are normally shared with the functional chip pins. When testing is performed, the test vector data is applied through the chains to control the sequential state of the circuit to a desired state. After application of a test vector, the test response data is captured by the flip-flops. The response data is shifted out through the scan chains and is compared against the expected response to check if the chip is functioning correctly.

Figure 1:
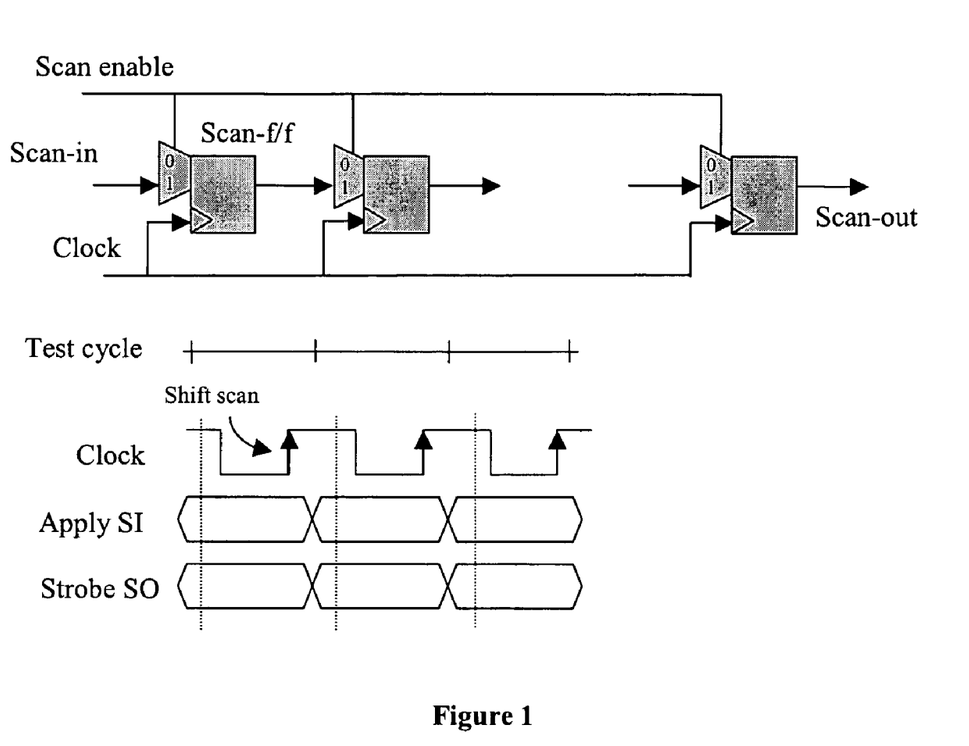
FIG. 1 shows an example of shifting scan data through a regular scan chain using a conventional scan chain.

In conventional scan chain design, a pair of I/O, or scan-in (SI) and scan-out (SO), pins is used to drive a scan chain, as shown in FIG. 1, which shows an example of shifting scan data through a regular scan chain using a conventional scan chain. Data through the chains shifts with each rising (or falling) edge of the clock. In each clock cycle, scan-in data is applied at the SI pin, and scan-out data is observed at the SO pin. The clock is strobed or pulsed to shift the data through the chain. This process is repeated based on the length of the chain, to completely flush the data out of the chain while filling the chain with new data at the same time.

The number of scan chains is usually limited to 16 or 32. The limit on the number of scan chains is bounded by the number of available input and output (I/O) pins that are able to access the chains, and by the number of scan-channels on the ATE used to drive the chains. For example, if one input and one output pin is required to access each chain, the number of the chains is limited to one half of the number of I/O pins.

The chains are usually balanced as much as possible to minimize the length of the longest chain. The number of tester cycles required to shift data through a chain is determined by the length of the chain, i.e. by the number of flip-flops in the chain. Therefore, the reduction in testing time is limited by the length of the chains.

Due to the large number of scan flip-flops and the long scan chain lengths, the majority of test application time is spent in shifting test data through scan chains. Increasing the number of scan chains would reduce the maximum length of the scan chains, thus reducing the number of test cycles required to shift data through the chains. This directly impacts the test cost by reducing the test application time.

The conventional approaches fail to efficiently and cost-effectively perform tests, because the constraints based on the number of available test pins for accessing chains, and/or the number of available scan channels on a tester usually limit the number of scan chains to 16 or 32. Therefore, the conventional approaches are inadequate for testing integrated circuits, because the required amount of testing time is inefficient for testing modern circuit designs. With the rising cost of performing manufacturing tests, it is critical to reduce the test application time, thereby reducing the test cost.

SUMMARY

A method for testing an integrated circuit includes scanning test data using an input pin and an output pin into a first scan chain during a first state of a clock cycle, and scanning test data from the same input and output pins into a second scan chain during a second state of the clock cycle.

DETAILED DESCRIPTION

A technique to reduce the test application time of an integrated circuit (IC) uses a dual scan chain design, where two chains are accessed from each scan-in/scan-out (SI/SO) pin pair. Independent scan data is shifted through the two chains from each set of SI/SO pins in each scan shift cycle. The dual scan chain design can be used with Automatic Test Pattern Generator (ATPG) based scan vectors to test the IC. Thus, the dual scan chain technique can be applied to test systems that implement scan designs that are tested with ATPG scan vectors. Dual scan chain interface logic may be included at the head of the scan chains, the tail of the chains, or both, to interface with the scan pins.

The dual scan chain technique allows shifting of scan data at twice the rate of a conventional scan chain design by doubling the number of scan chains driven from the same set of scan pins. Therefore, this technique can reduce the test application time of the IC by a factor of two, as compared with a conventional scan design based method, thus reducing the test application cost by half.

Figure 2:
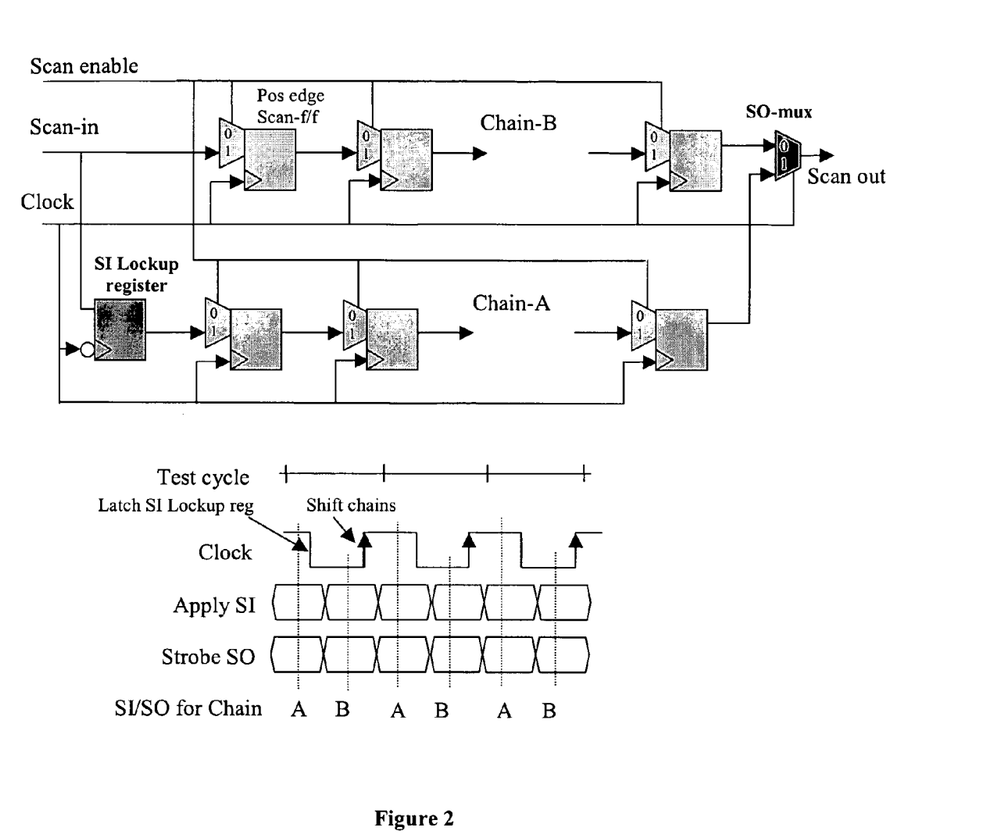
FIG. 2 shows an example of a device for shifting scan data through two dual-scan chains using the same SI/SO pins, with a negative edge SI lockup register at the front of chain A.

In a dual-scan chain design, two chains (as opposed to a single chain in conventional scan design) of about equal length are accessed from the same scan-in (SI) and scan-out (SO) pins, as shown in FIG. 2. A scan-in lockup register may be used at the head of the chains to lockup scan-in data. Similarly, a scan-out lockup register may be used at the tail end of chain to lockup scan-out data. Scan-out data from the two chains is routed through a scan-out multiplexor whose output is connected to the scan-out pin for the chains. The select signal for the scan-out multiplexor is controlled by the clock signal that shifts the scan flops.

The device for shifting scan data through two dual-scan chains of FIG. 2 uses the same SI/SO pins to access both chains. For example, the two chains, chain-A and chain-B, are connected to the same scan-in and scan-out pins. In this example, the scan-in and scan-out signals for chain-A are applied and accessed before the first edge of the clock in a given clock cycle. The scan-in and scan-out signals for chain-B are applied and accessed after the first edge of the clock signal, but before the second edge of the clock signal. The dual chains shown in FIG. 2 (chain-A and chain-B) have positively edge-triggered scan flip-flops. A scan-in lockup register, which is clocked at the opposite edge of the clock as that of the regular scan flops, is inserted at the front end of one of the chains, such as chain-A for example. A scan-out multiplexor is inserted at the tail end of the two chains. The select signal of the scan-out multiplexor is connected to the clock signal.

The clock signal of FIG. 2 has a return-to-one waveform. When the clock signal is high, the multiplexor causes scan-out data from chain-A to be read at the SO pin. Also, when the clock is high, the next scan-in value for chain-A is applied at the SI pin. As the clock falls, the negatively edge-triggered scan-in lockup latches the next scan-in value for chain A. When the clock is low, the scan-in value for chain-B is applied at the SI pin. Because the clock is low, the multiplexor causes the scan-out data from chain-B to be read at the SO pin. As the clock signal rises, both chains shift their scan data by one unit. The process is repeated for next scan-shift cycle until both chains have shifted completely.

The scan data at the SI/SO pins is applied and accessed twice in the same clock cycle, once before the rising edge (chain B), and once before the falling edge (chain A) of the clock. This allows access to the two chains through each pair of SI/SO scan pins rather than to only one chain. By doubling the number of scan chains, the maximum scan chain length is reduced to half, thus reducing the number of scan-shift cycles required to access scan chains by half. Since a majority of the test application time in scan-based test methodology is spent in shifting the scan chains, this scheme effectively reduces the test application time to about half, resulting in a similar reduction in test application cost.

Figure 3:
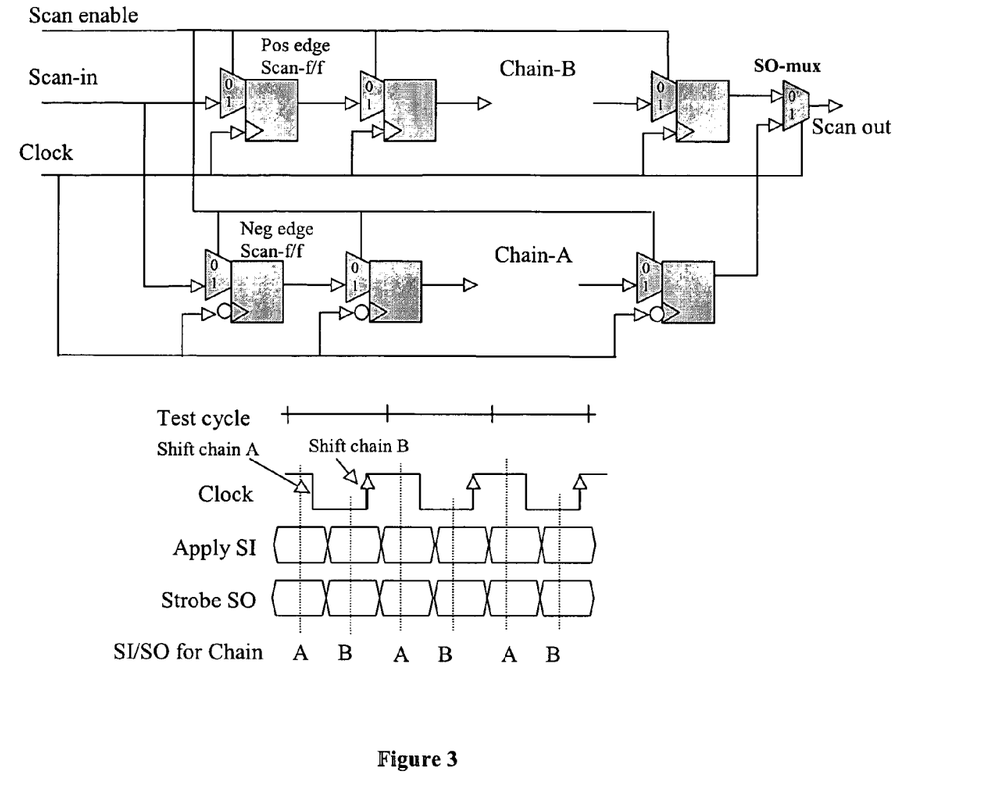
FIG. 3 shows an example of a device for shifting scan data through two dual-scan chains with positive and negative edge-triggered scan flops.

FIG. 3 shows an example of a device for shifting scan data through two dual-scan chains with positive and negative edge-triggered scan flops. If a design of an integrated circuit contains both positive edge triggered and negative edge triggered scan flops, then the device of FIG. 3 can access both of the dual-scan chains from the same scan-in pin without a scan-in lockup register, even though the chains have different edge triggered flops.

For example, when the clock is high, the SI and SO pins correspond to chain-A, which has negatively-edge triggered scan flip-flops. Scan-in data for chain A is applied at the SI pin, and the scan-out data from the same chain is strobed at the SO pin. As the clock signal falls (the negative edge on the clock), chain-A shifts scan data. When the clock is low, the SI and SO pins correspond to chain B, which has positively-edge triggered scan flip-flops. New scan data is applied at the SI pin for chain-B, and scan-out data from chain-B is observed at the SO pin. As the clock rises, scan data shifts through chain-B. The process is repeated for the next scan-shift cycle until data in both chains are shifted completely.

Figure 4:
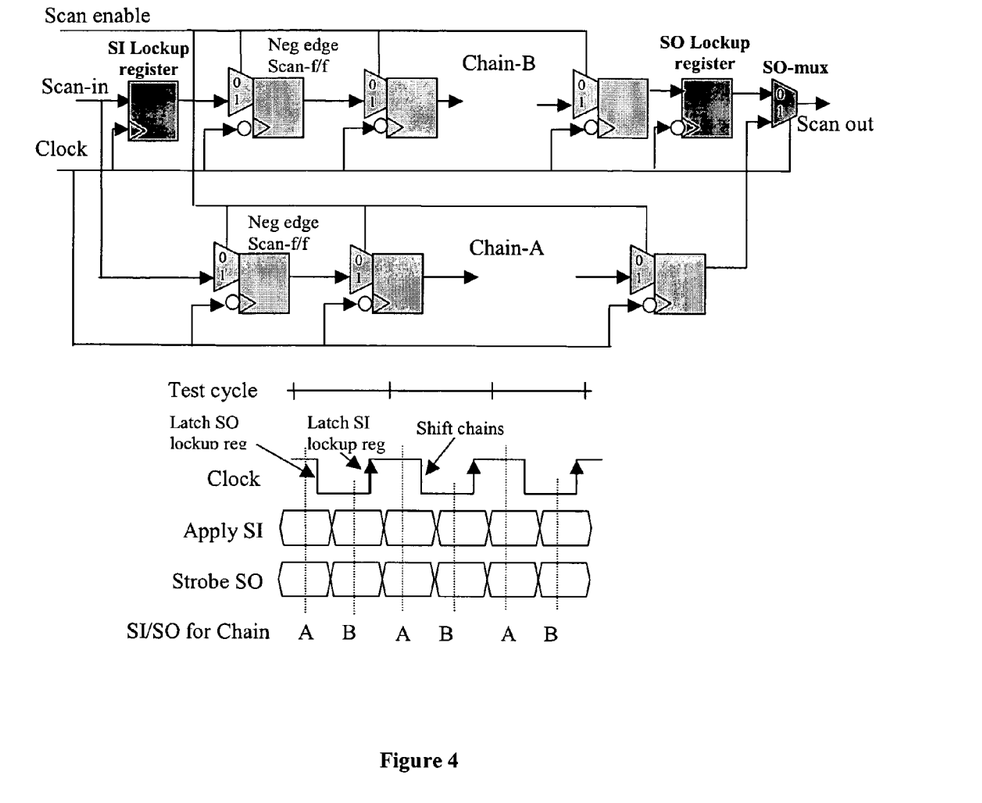
FIG. 4 shows an example of a dual scan chain design with negative edge-triggered scan flops, that has a positive edge-triggered SI lockup register at the front of chain B, and a negative edge-triggered SO lockup register at the end of chain B.

FIG. 4 shows an example of a dual scan chain technique applied to a design with negative edge-triggered scan flops. The SI lockup register as shown in FIG. 4 is positive edge triggered flip-flop, and the SO lockup register is a negative edge triggered flip-flop. As the clock starts at logic 1, scan-in data for chain A is applied at the SI pin, and scan-out data from chain A is observed at SO pin. As the clock signal falls to logic 0, the SO lockup register locks the scan-out data from chain B. With the clock signal at logic 0, scan-in data for chain B is applied at the SI pin, while the locked scan-out data from chain B is read at the SO pin. As the clock rises back to logic 1, the scan data for chain B is locked into the SI lockup register, making it available when data in chain B is shifted in the next scan shift cycle. In this example, both chains shift data at the negative edge of clock signal.

Figure 5:
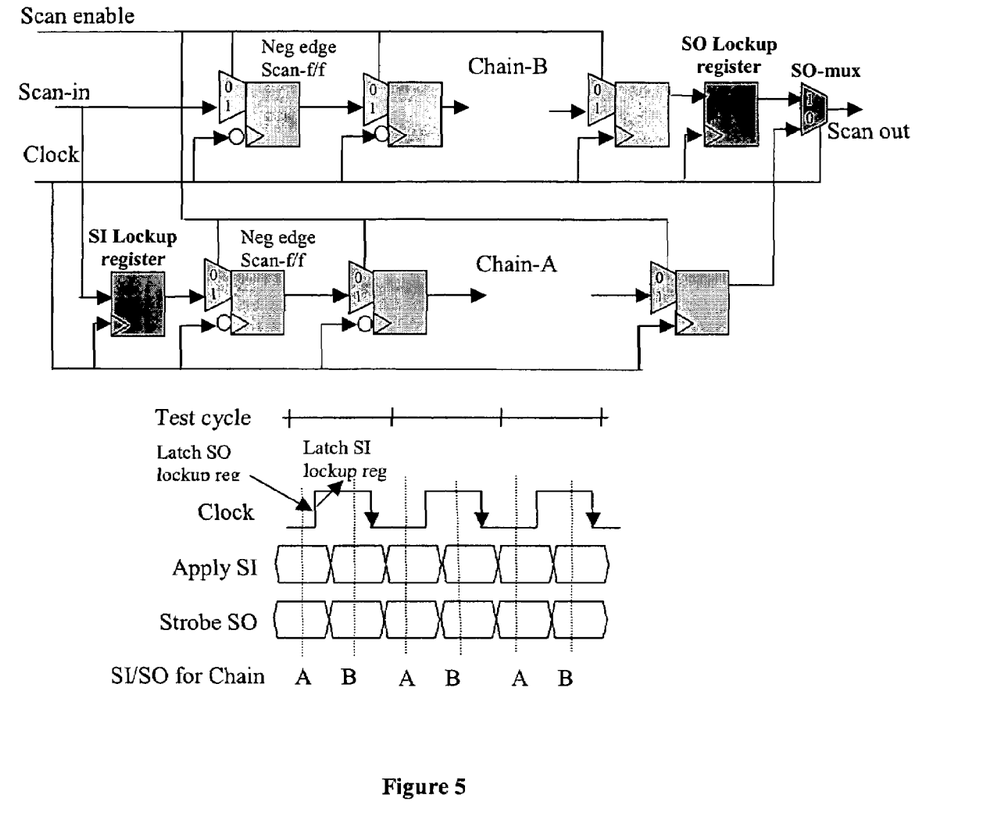
FIG. 5 shows an example of a device for shifting scan data through dual-scan chains with negative edge-triggered scan flops at the front, and positive edge-triggered scan flops at the tail end in a mixed edge-triggered scan flop design.

FIG. 5 shows an example of a device for shifting scan data through dual-scan chains in a mixed-edge triggered scan flop design (with negative edge-triggered scan flops at the beginning of the chains, and positive edge-triggered flops at the tail end of the chains). If there are multiple negative edge triggered scan flops in a mixed edge triggered scan design, then the device of FIG. 5 can provide a method to drive two negative edge triggered scan flip-flop chains from the same scan pin while still keeping the same clock waveform given in the examples discussed above. The design includes a scan-in lockup register at front of chain A, and a scan-out lockup register at the end of chain B.

The SI lockup register and SO lockup register, as shown in FIG. 5 are both positive edge triggered flip-flops. As the clock starts at logic 0, scan-in for chain A is applied at the SI pin, and scan-out data from chain A is observed at SO pin. As the clock signal rises to logic 1, the SI lockup register for chain A locks the scan-in data for chain A, and the SO lockup register locks the scan-out data from chain B. With the clock signal at logic 1, scan-in data for chain B is applied at the SI pin, while the locked scan-out data from chain B is read at the SO pin. As the clock falls back to logic 0, the scan data for chain B shifts from the SI pin, while data locked in chain-A SI lockup register shifts into chain A.

In this embodiment, positive edge triggered scan flops and negative edge triggered scan flops may be mixed in the same chain. Therefore, the dual scan chain design method is applicable to both positive-edge and negative-edge triggered scan flip-flop designs, including a design having two different edge triggered flip/flop chains that are accessed from the same pair of scan pins.

The following sets of design rules as shown in Tables 1 and 2 indicate which lockup registers to use for chain A and chain B of the dual-scan chain design, based on the triggering edge of the scan flip-flop at the head and tail end of the each chain. The rules shown in Table 1 are applicable when the clock waveform is return-to-one, i.e. the clock starts at logic 1, falls to logic 0, and then returns to logic 1. The rules of Table 2 are applicable when the clock waveform is return-to-zero, i.e. the clock starts at logic 0, rises to logic 1, and then returns to logic 0. In these examples, chain-A is accessed before the first edge on the clock signal, and chain-B is accessed after the first edge of the clock signal.

TABLE 1

SI/SO lockup register for Return-to-One clock waveform

| | | Triggering edge of scan flop | |
|---|---|---|---|
| | | Positive edge | Negative edge |
| Chain A | head | Negative edge triggered SI lockup register | none |
| | tail | none | none |

TABLE 1-continued

SI/SO lockup register for Return-to-One clock waveform

| | | Triggering edge of scan flop | |
|---|---|---|---|
| | | Positive edge | Negative edge |
| Chain B | head | none | Positive edge triggered SI lockup register |
| | tail | none | Negative edge triggered SO lockup register |

TABLE 2

SI/SO lockup register for Return-to-Zero clock waveform

| | | Triggering edge of scan flop | |
|---|---|---|---|
| | | Positive edge | Negative edge |
| Chain A | head | None | Positive edge triggered SI lockup register |
| | tail | None | none |
| Chain B | head | Negative edge triggered SI lockup register | none |
| | tail | Positive edge triggered SO lockup register | none |

For the return-to-one clock waveform, the scan-out multiplexor selects chain A when the clock signal is at logic 1, and selects chain B when the clock signal is at logic 0. For the return-to-zero clock waveform, the scan-out multiplexor selects chain A when the clock is at logic 0, and selects chain B when the clock is at logic 1.

For example, an integrated circuit design may include a return-to-zero clock waveform, with both chains having negative edge triggered scan flip-flop at head, and positive edge triggered scan flip-flop at the tail end. Then, based on the rules given in Table 2, the dual scan chain design would have a positive edge SI lockup register at the front of chain A, and a positive edge triggered SO lockup register at the end of chain B, as shown in FIG. 5. The scan-out multiplexor is configured such that chain A is selected when clock is at logic 0, and chain B is selected when clock is at logic 1.

As shown in FIG. 5, the clock starts at logic 0, scan-out from chain A is observed at the scan-out pin, and scan-in data for chain A is applied at scan-in pin. As the clock rises to logic 1, the SI lockup register latches the scan-in data for chain A, and the SO lockup register at the end of chain B latches scan data being shifted out of chain B. When clock is at logic 1, the scan-out data from chain B is observed at scan-out pin, while the scan-in data for chain B is applied at the scan-in pin. As the clock signal returns to logic 0, the scan-in data for chain A and chain B is shifted in. The process is repeated until both the chains are completely shifted.

Therefore, the design rules shown in Tables 1 and 2 can be used to determine the type of SI/SO lockup registers, if any, to use for chain A and chain B based on the clock waveform. The dual scan chain method is applicable to both positive edge triggered and negative edge triggered scan chain designs, including chain designs that mix the two edges. The dual scan chain method drives two scan chains from the same set of scan-in/out pins. This allows the method to drive twice as many scan chains from the same number of scan pins as compared with conventional methods.

The dual scan chain method also can independently drive the two scan chains from the same set of scan-in/out pins, in contrast to some of the previous techniques, e.g. Illinois Scan chain design, which broadcast the same test data from a scan pin to multiple chains. The conventional techniques are forced to feed the same data through the chains, whereas in the dual-scan chain design, the two chains can receive independent and different scan data during the same scan cycle. The independently driven dual scan chains therefore reduce the test application time to half of that of the conventional method, without a change in the scan chain design, fault coverage or test quality. Furthermore, the dual chain design does not require a multi-input-signature register (MISR) to compress the data coming out of the dual chains, unlike the conventional approach of the Illinois scan chain design. However, one can use a MISR to compress output test data, if so desired.

Test vectors for a design to can be applied to this scheme using scan based ATPG vectors. Therefore, with the dual scan chain design, an Automatic Test Pattern Generator can be used, without modification, to reduce the test application time. This technique can also be applied to built-in-self-test (BIST) methodology to drive double the number of scan chains from the same size on-chip test generator, while running the test generator at twice the speed.

These and other embodiments of the present invention may be realized in accordance with the above teachings and it should be evident that various modifications and changes may be made to the above described embodiments without departing from the broader spirit and scope of the invention. The specification and drawings are, accordingly, to be regarded in an illustrative rather than restrictive sense and the invention measured only in terms of the claims.

The invention claimed is:

1. A method for testing an integrated circuit using dual scan chains, comprising:
   scanning a first test data from an input pin into a first scan chain during a first state of a clock cycle to test the integrated circuit;
   scanning a second test data from the input pin into a second scan chain during a second state of the clock cycle to test the integrated circuit; and
   associating a lockup register with a beginning or ending circuit element of the first or second scan chains, wherein a design rule for the act of associating the lockup register with the first or second scan chains associated with the lockup register are based at least in part upon a type of clock waveform and a triggering edge of the beginning or ending circuit element; wherein a clock signal of the clock cycle is input to the first scan chain and the second scan chain during testing.

2. The method of claim 1 further comprising:
   receiving test data from the first scan chain at an output pin during the first state of the clock cycle.

3. The method of claim 2 further comprising:
   receiving test data from the second scan chain at the output pin during the second state of the clock cycle.

4. The method of claim 3 further comprising:
   sending test data from the first and second scan chains to a multiplexor;
   applying a select signal to the multiplexor based on the state of the clock signal; and
   causing the multiplexor to output test data from either the first or second scan chain to the output pin based on the select signal.

5. The method of claim 1, wherein scanning the first test data comprises:
   using a return-to-one clock waveform; and
   using positive, negative, or a mixture of positive and negative triggered scan flip-flops in the first scan chain;

wherein scanning the second test data comprises;
using the return-to-one clock waveform; and
using positive, negative, or a mixture of positive and negative triggered scan flip-flops in the second scan chain.

6. The method of claim 5, further comprising:
associating a lockup register with a beginning flip-flop or an ending flip-flop of the first or second scan chains based on return-to-one selection criteria.

7. The method of claim 6, wherein associating a lockup register with the beginning flip-flop or the ending flip-flop of the first or second scan chains based on return-to-one selection criteria comprises:
associating a negative edge triggered scan-in lockup register with the beginning flip-flop of the first scan chain when the beginning flip-flop of the first scan chain has a positive edge trigger;
associating a positive edge triggered scan-in lockup register with the beginning flip-flop of the second scan chain when the beginning flip-flop of the second scan chain has a negative edge trigger; and
associating a negative edge triggered scan-out lockup register when the ending flip-flop of the second scan chain has a negative edge trigger.

8. The method of claim 1, wherein scanning the first test data comprises:
using a return-to-zero clock waveform; and
using positive, negative, or a mixture of positive and negative triggered scan flip-flops in the first scan chain;
wherein scanning the second test data comprises;
using the return-to-zero clock waveform; and
using positive, negative, or a mixture of positive and negative triggered scan flip-flops in the second scan chain.

9. The method of claim 8, further comprising:
associating a lockup register with a beginning flip-flop or an ending flip-flop of the first or second scan chains based on return-to-zero selection criteria.

10. The method of claim 9, wherein associating a lockup register with the beginning flip-flop or the ending flip-flop of the first or second scan chains based on return-to-zero selection criteria comprises:
associating a positive edge triggered scan-in lockup register with the beginning flip-flop of the first scan chain when the beginning flip-flop of the first scan chain has a negative edge trigger;
associating a negative edge triggered scan-in lockup register with the beginning flip-flop of the second scan chain when the beginning flip-flop of the second scan chain has a positive edge trigger; and
associating a positive edge triggered scan-out lockup register when the ending flip-flop of the second scan chain has a positive edge trigger.

11. An apparatus for testing an integrated circuit using dual scan chains, comprising:
means for scanning a first test data from an input pin into a first scan chain during a first state of a clock cycle to test the integrated circuit;
means for scanning a second test data from the input pin into a second scan chain during a second state of the clock cycle to test the integrated circuit; and
means for associating a lockup register with a beginning or ending circuit element of the first or second scan chains, wherein a design rule for the act of associated the lockup register with the first or second scan chains associated with the lockup register are based at least in part upon a type of clock waveform and a triggering edge of the beginning or ending circuit element; wherein a clock signal of the clock cycle is input to the first scan chain and the second scan chain during testing.

12. The apparatus of claim 11 further comprising:
means for receiving test data from the first scan chain at an output pin during the first state of the clock cycle.

13. The apparatus of claim 12 further comprising:
means for receiving test data from the second scan chain at the output pin during the second state of the clock cycle.

14. The apparatus of claim 13 further comprising:
means for sending test data from the first and second scan chains to a multiplexor;
means for applying a select signal to the multiplexor based on the state of the clock signal; and
means for causing the multiplexor to output test data from either the first or second scan chain to the output pin based on the select signal.

15. The apparatus of claim 11, wherein said means for scanning the first test data comprises:
means for using a return-to-one clock waveform; and
means for using positive, negative, or a mixture of positive and negative triggered scan flip-flops in the first scan chain;
wherein said means for scanning the second test data comprises;
means for using the return-to-one clock waveform; and
means for using positive, negative, or a mixture of positive and negative triggered scan flip-flops in the second scan chain.

16. The apparatus of claim 15, further comprising:
means for associating a lockup register with a beginning flip-flop or an ending flip-flop of the first or second scan chains based on return-to-one selection criteria.

17. The apparatus of claim 16, wherein said means for associating a lockup register with the beginning flip-flop or the ending flip-flop of the first or second scan chains based on return-to-one selection criteria comprises:
means for associating a negative edge triggered scan-in lockup register with the beginning flip-flop of the first scan chain when the beginning flip-flop of the first scan chain has a positive edge trigger;
means for associating a positive edge triggered scan-in lockup register with the beginning flip-flop of the second scan chain when the beginning flip-flop of the second scan chain has a negative edge trigger; and
means for associating a negative edge triggered scan-out lockup register when the ending flip-flop of the second scan chain has a negative edge trigger.

18. The apparatus of claim 11, wherein said means for scanning the first test data comprises:
means for using a return-to-zero clock waveform; and
means for using positive, negative, or a mixture of positive and negative triggered scan flip-flops in the first scan chain;
wherein said means for scanning the second test data comprises;
means for using the return-to-zero clock waveform; and
means for using positive, negative, or a mixture of positive and negative triggered scan flip-flops in the second scan chain.

19. The apparatus of claim 18, further comprising:
means for associating a lockup register with a beginning flip-flop or an ending flip-flop of the first or second scan chains based on return-to-zero selection criteria.

20. The apparatus of claim 19, wherein said means for associating a lockup register with the beginning flip-flop or the ending flip-flop of the first or second scan chains based on return-to-zero selection criteria comprises:

means for associating a positive edge triggered scan-in lockup register with the beginning flip-flop of the first scan chain when the beginning flip-flop of the first scan chain has a negative edge trigger;

means for associating a negative edge triggered scan-in lockup register with the beginning flip-flop of the second scan chain when the beginning flip-flop of the second scan chain has a positive edge trigger; and means for associating a positive edge triggered scan-out lockup register when the ending flip-flop of the second scan chain has a positive edge trigger.

* * * * *

UNITED STATES PATENT AND TRADEMARK OFFICE
CERTIFICATE OF CORRECTION

PATENT NO. : 7,657,809 B1 Page 1 of 1
APPLICATION NO. : 10/718445
DATED : February 2, 2010
INVENTOR(S) : Sandeep Bhatia It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 295 days.

Signed and Sealed this

Thirtieth Day of November, 2010

David J. Kappos
*Director of the United States Patent and Trademark Office*